US008723713B2

(12) United States Patent
Matsuno et al.

(10) Patent No.: US 8,723,713 B2
(45) Date of Patent: May 13, 2014

(54) SIGNAL INTERPOLATION DEVICE AND PARALLEL A/D CONVERTING DEVICE

(71) Applicants: Junya Matsuno, Kawasaki (JP); Tetsuro Itakura, Tokyo (JP)

(72) Inventors: Junya Matsuno, Kawasaki (JP); Tetsuro Itakura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/717,410

(22) Filed: Dec. 17, 2012

(65) Prior Publication Data

US 2013/0201048 A1    Aug. 8, 2013

(30) Foreign Application Priority Data

Feb. 7, 2012    (JP) .................................. 2012-24184

(51) Int. Cl.
*H03M 1/36*    (2006.01)

(52) U.S. Cl.
USPC .......................................... 341/159; 341/155

(58) Field of Classification Search
USPC ................... 341/155, 159; 330/250, 261, 252
See application file for complete search history.

(56) References Cited

U.S. PATENT DOCUMENTS

| | | | |
|---|---|---|---|
| 6,614,379 B2 * | 9/2003 | Lin et al. ........................ | 341/158 |
| 6,710,734 B2 * | 3/2004 | Ono et al. ...................... | 341/159 |
| 7,271,755 B2 * | 9/2007 | Mulder et al. ................. | 341/154 |
| 7,696,916 B2 * | 4/2010 | Shimizu et al. ................ | 341/159 |
| 8,130,131 B2 * | 3/2012 | Nakajima ...................... | 341/158 |
| 8,497,943 B2 * | 7/2013 | Chang et al. .................. | 348/674 |
| 2012/0044103 A1 | 2/2012 | Kaihara et al. | |

FOREIGN PATENT DOCUMENTS

| | | |
|---|---|---|
| JP | 3113031 B2 | 11/2000 |
| JP | 2010-278557 A | 12/2010 |

OTHER PUBLICATIONS

Applicant-provided Background Art Information Sheet.

* cited by examiner

*Primary Examiner* — Peguy Jean Pierre
(74) *Attorney, Agent, or Firm* — Holtz, Holtz, Goodman & Chick, PC

(57) ABSTRACT

There is provided a signal interpolation device, including: a first amplifier to generate a first signal representing a difference between an input signal and a first reference voltage; a second amplifier to generate a second signal representing a difference between the input signal and a second reference voltage; a first output amplifier to amplify the first signal to generate a first output signal; a second output amplifier to amplify the second signal to generate a second output signal; a third output amplifier to amplify a sum of a first interpolation signal and the first signal to generate a third output signal, the first interpolation signal representing a voltage generated by dividing a difference between the first reference voltage and the second reference voltage by "$2^n$"; and a fourth output amplifier to amplify a difference between the second signal and the first interpolation signal to generate a fourth output signal.

9 Claims, 5 Drawing Sheets

US 8,723,713 B2

SIGNAL INTERPOLATION DEVICE AND PARALLEL A/D CONVERTING DEVICE

CROSS REFERENCE TO RELATED APPLICATIONS

This application is based upon and claims the benefit of priority from the prior Japanese Patent Application No. 2012-24184, filed on Feb. 7, 2012, the entire contents of which are incorporated herein by reference.

FIELD

Embodiments described herein relate to a signal interpolation device and a parallel A/D converting device.

BACKGROUND

Conventionally, in a parallel A/D converter, an interpolation technique which generates a comparison value by interpolation in order to reduce the number of preamplifiers has widely been used. Use of this interpolation technique slightly reduces the number of preamplifiers. However, further reduction of the number of preamplifiers and power consumption has been desired.

DETAILED DESCRIPTION

According to some embodiments, there is provided a signal interpolation device, including: a first amplifier, a second amplifier, a first output amplifier, a second output amplifier, a third output amplifier and a fourth output amplifier.

The first amplifier generates a first signal representing a difference between an input signal and a first reference voltage.

The second amplifier generates a second signal representing a difference between the input signal and a second reference voltage.

The first output amplifier amplifies the first signal to generate a first output signal.

The second output amplifier amplifies the second signal to generate a second output signal.

The third output amplifier amplifies a sum of a first interpolation signal and the first signal to generate a third output signal, the first interpolation signal representing a voltage generated by dividing a difference between the first reference voltage and the second reference voltage by "2^n" ("n" is an integer of at least two).

The fourth output amplifier amplifies a difference between the second signal and the first interpolation signal to generate a fourth output signal.

Hereinafter, referring to drawings, embodiments will be described.

Figure 1:
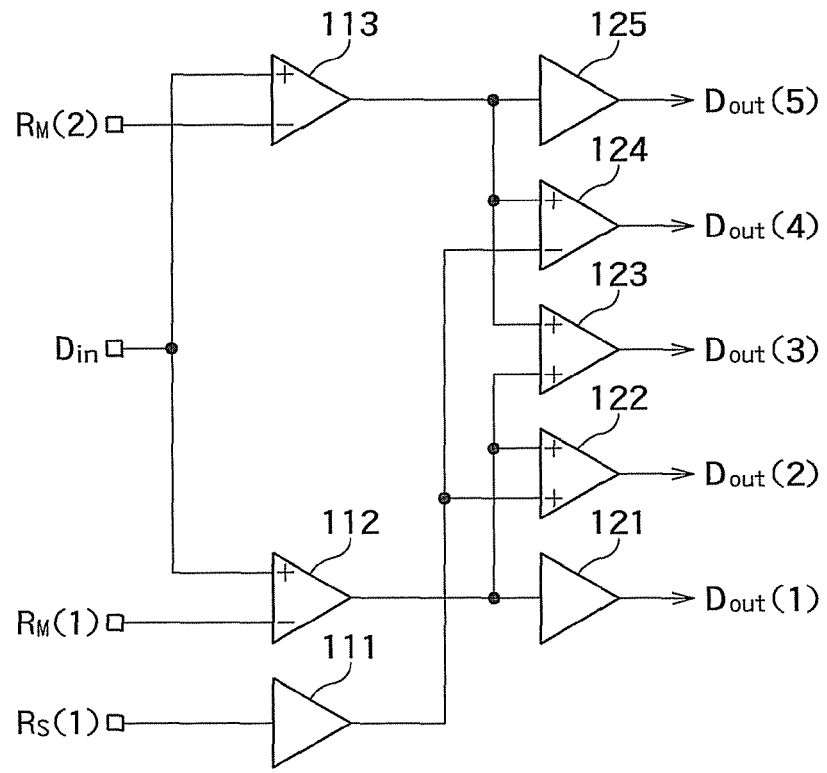
FIG. 1 is a block diagram of a signal interpolation device for a parallel A/D converter according to a first embodiment.

FIG. 1 is a block diagram of a signal interpolation device for a parallel A/D converter according to a first embodiment.

This device newly adopts an interpolation voltage "$R_S(1)$", in addition to reference voltages "$R_M(1)$" and "$R_M(2)$" used in a conventional parallel A/D converter. The reference voltages "$R_M(1)$" and "$R_M(2)$" are two of voltages acquired by dividing a voltage representing an input range of an input signal "Din", which is to be a target of AD conversion. The dividing can be done by means of any methods, such as resistive division and capacitive division. For instance, the voltages are adjacent two of voltages acquired by division.

An amplifier 112 (first amplifier), into which an input signal "Din" and a reference voltage "$R_M(1)$" (first reference voltage) are input, generates and outputs a first signal representing a difference therebetween. More specifically, the amplifier 112 amplifies the difference by a gain A, and outputs the amplified signal as the first signal.

An amplifier 113 (second amplifier), into which the input signal and a reference voltage "$R_M(2)$" (second reference voltage) are input, generates a second signal representing a difference therebetween. More specifically, the amplifier 113 amplifies the difference by the gain A and outputs the amplified signal as the second signal.

An amplifier 111 amplifies an interpolation voltage "$R_S(1)$" by the gain A, and outputs the amplified voltage as a first interpolation signal. The interpolation voltage "$R_S(1)$" has a value acquired by dividing a difference between the reference voltage "$R_M(1)$" and the reference voltage "$R_M(2)$" by "2^n" ("n" is an integer which is at least two). "2^n" means "n-th" power of two. For instance, provided that "$R_M(1)$" is 0.6 V, "$R_M(2)$" is 0.8 V and n=2, "$R_S(1)$" is 0.05.

The amplifier 121 (first output amplifier) amplifies the signal (first signal) from the amplifier 112 by a gain B, and outputs a signal "$D_{out}(1)$". The signal "$D_{out}(1)$" corresponds to, for instance, a first output signal.

An amplifier 125 (second output amplifier) amplifies the signal (second signal) from the amplifier 113 by the gain B and outputs a signal "$D_{out}(5)$". The signal "$D_{out}(5)$" corresponds to, for instance, a second output signal.

The amplifier 122 (third output amplifier) amplifies a sum of the signal (first interpolation signal) from the amplifier 111 and the signal from the amplifier 112 by the gain B, and outputs a signal "$D_{out}(2)$". The signal "$D_{out}(2)$" corresponds to, for instance, a third output signal.

An amplifier 124 (fourth output amplifier) amplifies the signal from the amplifier 113 and the signal (first interpolation signal) from the amplifier 111 by the gain B, and outputs a signal "$D_{out}(4)$". The signal "$D_{out}(4)$" corresponds to, for instance, a fourth output signal.

An amplifier 123 amplifies the sum of the signal from the amplifier 112 and the signal from the amplifier 113 by a gain of "B/2", and outputs a signal "$D_{out}(3)$". The signal "$D_{out}(3)$" corresponds to, for instance, a fifth output signal.

More specifically, provided that gains "A=1" and "B=1", following outputs are acquired.

$$D_{out}(1) = D_{in} - R_M(1)$$

$$D_{out}(2) = D_{in} - R_M(1) + R_S(1)$$

$$D_{out}(3) = D_{in} - \frac{R_M(1) + R_M(2)}{2}$$

$$D_{out}(4) = D_{in} - R_M(2) - R_S(1)$$

$$D_{out}(5) = D_{in} - R_M(2)$$

In the case where "$R_M(1)$" is 0.6 V, "$R_M(2)$" is 0.8 V and "$R_S(1)$" is −0.05, "$D_{out}(1)$", "$D_{out}(2)$", "$D_{out}(3)$", "$D_{out}(4)$" and "$D_{out}(5)$" are output signals corresponding to respective reference voltages of 0.6 V, 0.65 V, 0.7 V, 0.75 V and 0.8 V. Thus, the interpolation voltage "$R_S(1)$" is amplified by a gain equivalent to that of the amplifiers 112 and 113, and subjected to addition and subtraction with the output signals of the amplifiers 112 and 113, thereby allowing output signals of voltages interpolated by reference voltages to be acquired.

On stages after the amplifier 121 to 125, each output signal is compared with the reference value, and each comparison result is encoded, thereby acquiring binary data as an AD-converted result. This point will be described in following embodiments.

As described above, in comparison with the conventional art, the number of amplifiers can be reduced. More specifically, in the conventional art, three amplifiers connected to the outputs of the amplifiers 113 and 112 are additionally required. However, this embodiment can eliminate these amplifiers.

Although the amplifier 111 is an amplifier newly added in this embodiment, this amplifier amplifies only direct current. Accordingly, low power consumption can be realized.

The gains of the amplifiers described above are only examples. The embodiment is not limited thereto. For instance, the gain of the amplifier 111 can be reduced, and the amount of reduction can be compensated with the amplifiers 124 and 122 to which the output of the amplifier 111 is connected.

Figure 2:
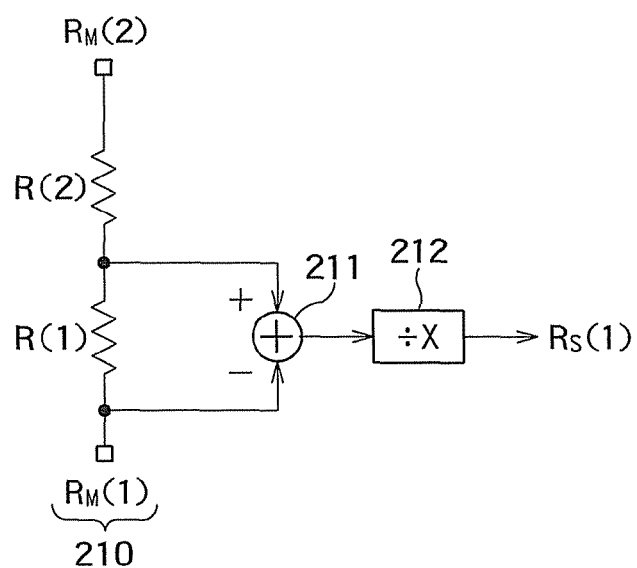
FIG. 2 is a block diagram of a configuration generating an interpolation voltage.

FIG. 2 is a block diagram of an example of a configuration generating the interpolation voltage "$R_S(1)$" in FIG. 1.

A voltage divider 210 divides between the reference voltage "$R_M(2)$" and the reference voltage "$R_M(1)$" by resistors "$R(1)$" and "$R(2)$", and acquires a divided signal. In this example, a voltage signal at a connection point between the resistors "$R(1)$" and "$R(2)$" is acquired as the divided signal.

A subtractor 211 generates a difference signal between the divided signal and the reference voltage "$R_M(1)$". In another example, the subtractor may generate a difference signal between the reference voltage "$R_M(2)$" and the divided signal.

A divider 212 generates the interpolation voltage "$R_S(1)$" by dividing the difference signal acquired from the subtractor 211 by a predetermined value X. In the aforementioned example, in the case where X=2, "$R_S(1)$=0.05" is acquired.

Figure 3:
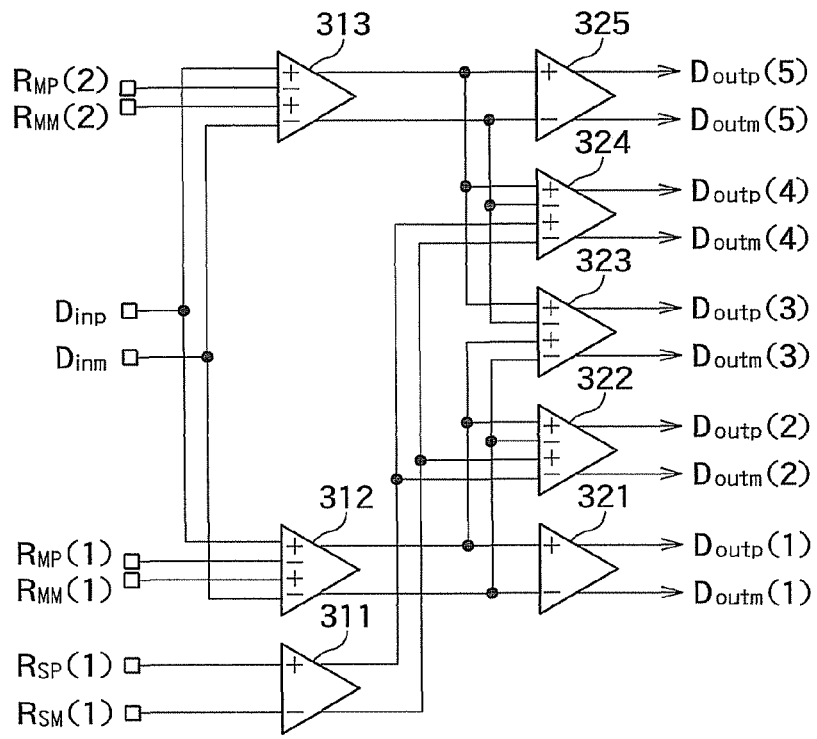
FIG. 3 is a block diagram of a signal interpolation device for a parallel A/D converter according to a second embodiment.

FIG. 3 is a block diagram showing a signal interpolation device for a parallel A/D converter according to a second embodiment. More specifically, this device has a configuration where the signal interpolation device in FIG. 1 is differentiated. The amplifiers 113, 112, 122, 123 and 124 in FIG. 1 are embodied as amplifiers 313, 312, 322, 323 and 324 with four inputs and two outputs. The amplifiers 111, 121 and 125 in FIG. 1 are embodied as differential amplifiers 311, 321 and 325. Hereinafter, a difference from FIG. 1 will be mainly described.

Differential signals "$D_{inp}$" and "$D_{inm}$" are input as the input signal. Differential signals "$R_{SP}(1)$" and "$R_{SM}(1)$" representing the interpolation voltage are input. The amplifier 311 amplifies the differential signals "$R_{SP}(1)$" and "$R_{SM}(1)$" and outputs the amplified signals.

The amplifier 312 generates first differential signals representing differences between differential signals "$R_{MP}(1)$" and "$R_{MM}(1)$" representing the first reference voltage and the input signals "$D_{inp}$" and "$D_{inm}$", and outputs the generated signals. More specifically, the differences signals are amplified, and the amplified signals are output as the first differential signals.

The amplifier 313 generates second differential signals representing differences between the differential signals "$R_{MP}(2)$" and "$R_{MM}(2)$" representing the second reference voltage and the input signals "$D_{inp}$" and "$D_{inm}$", and outputs the generated signals. More specifically, the differences signals are amplified, and the amplified signals are output as the second differential signals.

The amplifier 321 amplifies the first differential signals output from the amplifier 312, and outputs the amplified differential signals (first output differential signals).

The amplifier 325 amplifies the second differential signals output from the amplifier 313, and outputs the amplified differential signals (second output differential signals).

The amplifier 322 amplifies sums of the first differential signals output from the amplifier 312 and the differential signals output from the amplifier 311, and outputs the amplified differential signals (third output differential signals).

The amplifier 324 amplifies differences between the second differential signals output from the amplifier 313 and the differential signals from the amplifier 311, and outputs the amplified differential signals (fourth output differential signals).

The amplifier 323 amplifies a sum of the first and second differential signals from the amplifiers 312 and 313, and outputs the amplified differential signals (fifth output differential signals).

The gain of each amplifier in FIG. 3 may be any value. For instance, the example of gains ("A" and "B") described in the first embodiment may be used.

Figure 4:
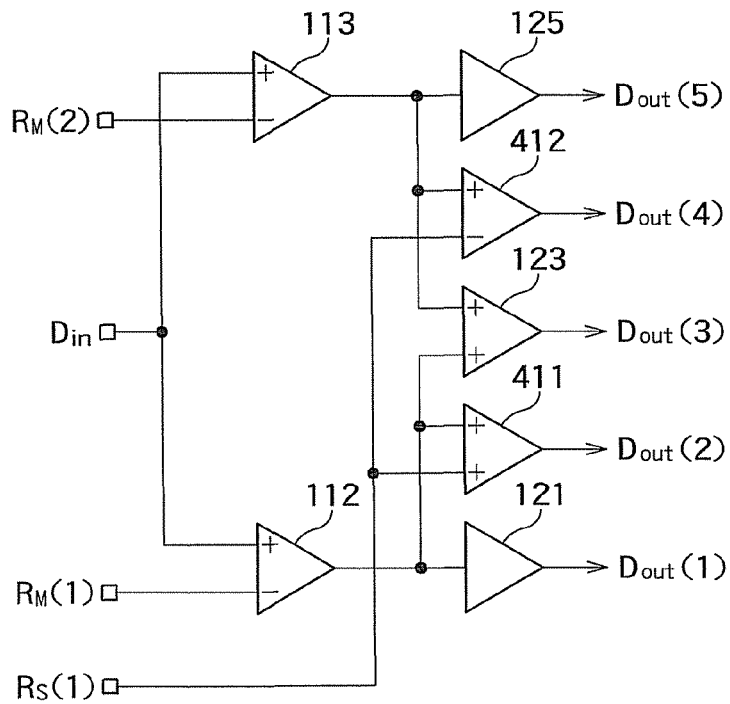
FIG. 4 is a block diagram of a signal interpolation device for a parallel A/D converter according to a third embodiment.

FIG. 4 is a block diagram showing another example of a configuration of a signal interpolation device for a parallel A/D converter according to a third embodiment.

In the configuration, the amplifier 111 in FIG. 1 is removed to facilitate reduction in area. The amount of gain of the amplifier 111 is compensated by amplifiers 411 and 412.

For instance, in the case shown in FIG. 1 where the gain of the amplifier 112 is "A" and the gain of the amplifier 121 is "B", the amplification gains of the output signal of the amplifier 112 and the interpolation voltage "$R_S(1)$", which are input into the amplifier 411, are "B" and "A×B". This holds also on the amplifier 412. Accordingly, interpolation equivalent to that of the signal interpolation device in FIG. 1 can be realized.

Figure 5:
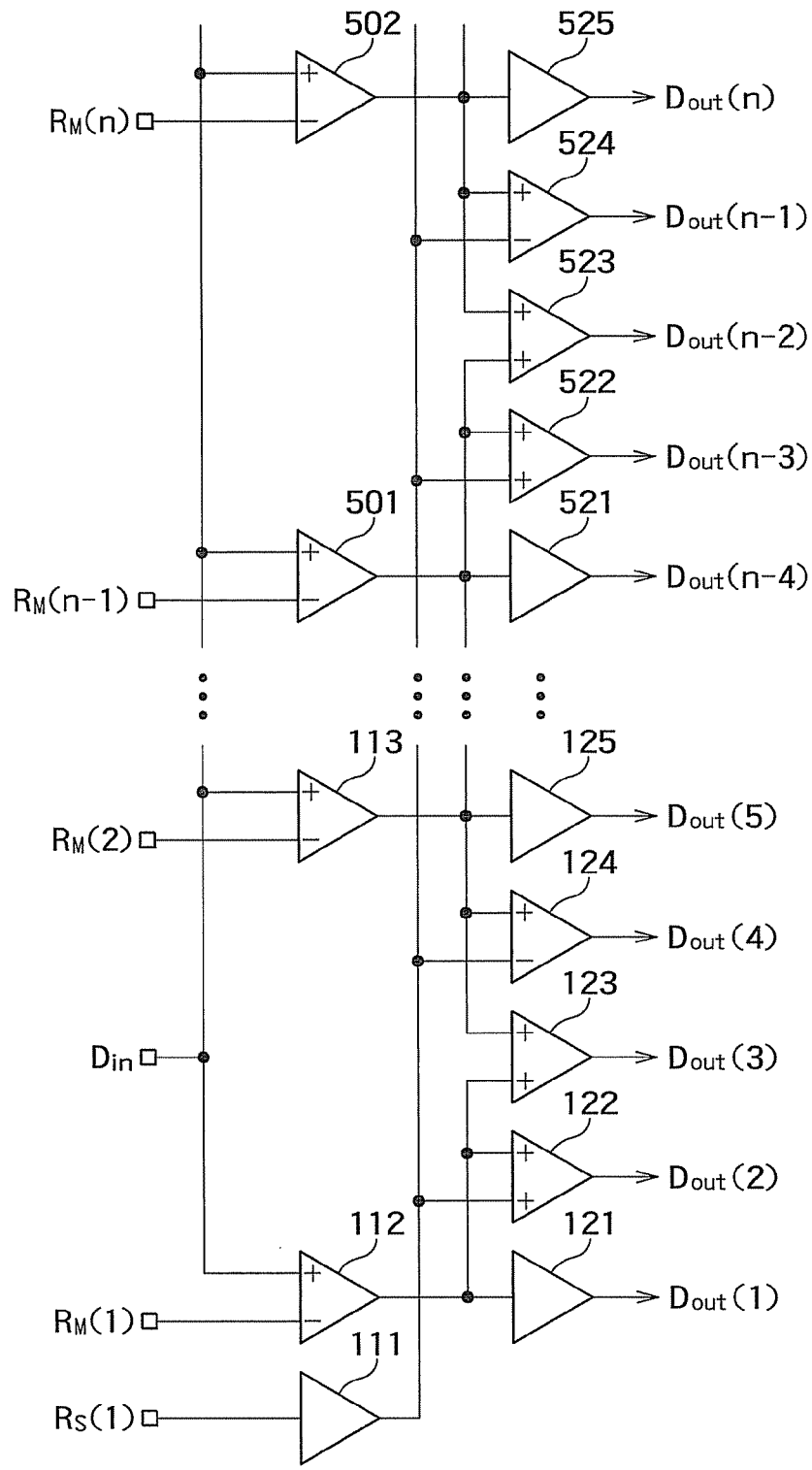
FIG. 5 is a block diagram of a signal interpolation device for a parallel A/D converter according to a fourth embodiment.

FIG. 5 is a block diagram of a signal interpolation device for a parallel A/D converter according to a fourth embodiment.

In the first embodiment, the number of reference voltages "$R_M$" is two. Meanwhile, this embodiment describes the case where the number of reference voltages "$R_M$" is extended to "n". For instance, "n" may be an integer of at least three. The difference in configuration from FIG. 1 will be described below.

Here, the configuration of the case where the number of reference voltages is three will be described. It may be considered that, in this configuration, the illustrated "$R_M(n-1)$"

and "$R_M(2)$" coincide with each other, the amplifiers 501 and 113 coincide with each other, and the amplifiers 521 and 125 coincide with each other.

The amplifier 502 (third amplifier) generates a third signal representing a difference between the input signal "Din" and the reference voltage "$R_M(n)$" (third reference voltage). More specifically, the amplifier 502 amplifies the difference and outputs the amplified signal as the third signal.

An amplifier 525 (sixth output amplifier) amplifies a signal (third signal) from an amplifier 520, and outputs a signal $D_{out}(n)$. The signal $D_{out}(n)$ corresponds to, for instance, a sixth output signal.

An amplifier 522 (seventh output amplifier) amplifies a sum of the interpolation voltage "$R_S(1)$" and the signal from the amplifier 501 (amplifier 113), and outputs a signal $D_{out}(n-3)$. The signal $D_{out}(n-3)$ corresponds to, for instance, a seventh output signal.

An amplifier 524 (eighth output amplifier) amplifies a difference between the signal from the amplifier 502 and the interpolation voltage "$R_S(1)$", and outputs a signal $D_{out}(n-1)$. The signal $D_{out}(n-1)$ corresponds to, for instance, an eighth output signal.

The amplifier 523 amplifies the sum of the signal from the amplifier 502 and the signal from the amplifier 501 (amplifier 113), and outputs a signal $D_{out}(n-2)$. The signal $D_{out}(n-2)$ corresponds to, for instance, a ninth output signal.

Thus, also in the case where the number of reference voltages is at least three, the signal interpolation device according to this embodiment can be realized.

Figure 6:
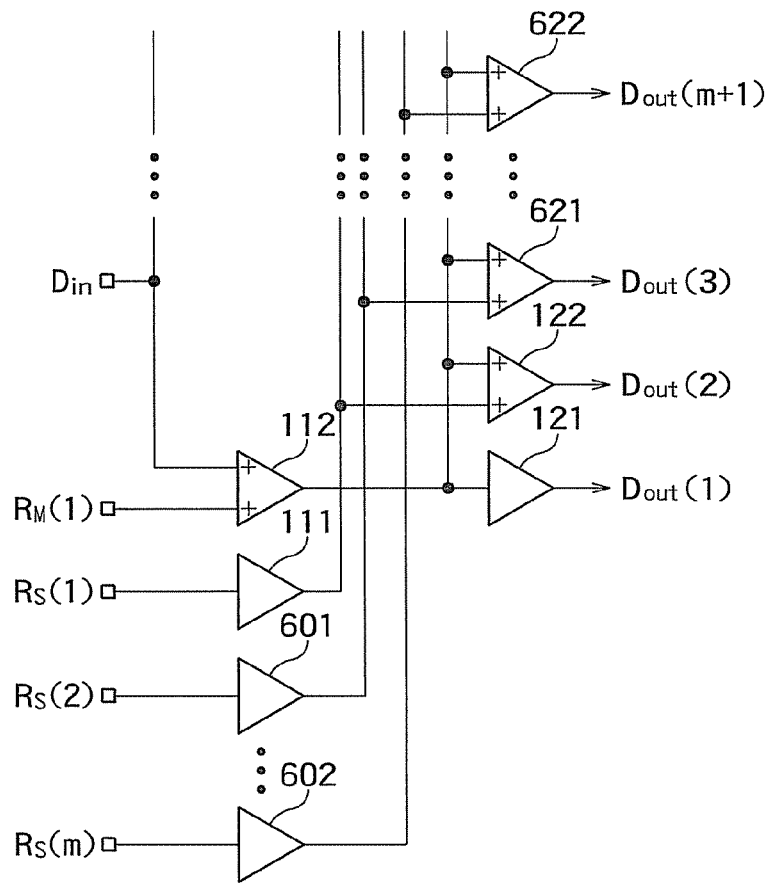
FIG. 6 is a block diagram of a signal interpolation device for a parallel A/D converter according to a fifth embodiment.

FIG. 6 is a block diagram of a signal interpolation device for a parallel A/D converter according to a fifth embodiment. This embodiment describes the case where the number of interpolation voltages "$R_S$" in FIG. 1 is extended to "m". Any interpolation value can be realized by providing any number of any interpolation voltages.

In addition to the interpolation voltage "$R_S(1)$" and the amplifier 111 shown in FIG. 1, "m−1" interpolation voltages "$R_S(2)$", ..., "$R_S(m)$" and "m−1" amplifiers 601, ..., 602 are added. The amplifiers 601, ..., 602 amplify the signals of the interpolation voltages "$R_S(2)$", ..., "$R_S(m)$", and output the amplified signals.

As with the interpolation voltage "$R_S(1)$", the interpolation voltages "$R_S(2)$", ... "$R_S(m)$" have values which are acquired by dividing a difference between the reference voltage "$R_M(1)$" and the reference voltage "$R_M(2)$" by "$2^n$" ("n" is an integer of at least two), and correspond to different values of "n". For instance, provided that "$R_M(1)$" corresponds to 0.6 V, "$R_M(2)$" corresponds to 0.8 V, and "$R_S(1)$", "$R_S(2)$" and "$R_S(3)$" correspond to "n"=2, 3 and 4, respectively, "$R_S(1)$" is 0.05, "$R_S(2)$" is 0.025 and "$R_S(3)$" is 0.0125.

In accordance with addition of the interpolation voltages "$R_S(2)$", ..., "$R_S(m)$", amplifiers of the output side (third output amplifiers) are also added. That is, "m−1" amplifiers (third output amplifiers) 621, ..., 622 are added, which amplify sums of output signals of the amplifiers 601, ..., 602 and the signal (first signal) from the amplifier 112 to generate output signals.

Likewise, the "m−1" fourth output amplifiers (not shown) are added, which amplify differences between a signal (second signal) from the amplifier 113 (see FIG. 1) and the output signals from the amplifiers 601, ..., 602 to generate respective output signals.

As described above, increase in the number of interpolation voltages can perform finer interpolation.

Figure 7:
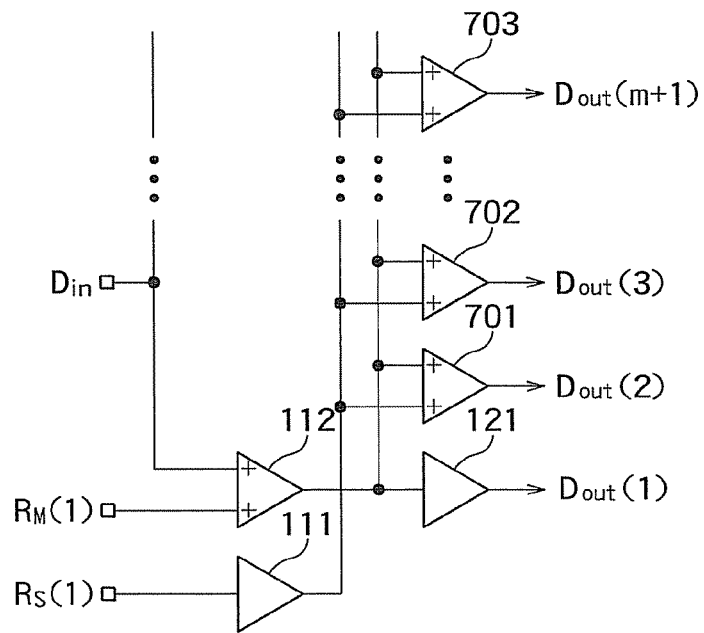
FIG. 7 is a block diagram of a signal interpolation device for a parallel A/D converter according to a sixth embodiment.

FIG. 7 is a block diagram of a signal interpolation device for a parallel A/D converter according to a sixth embodiment. This embodiment describes a case of using only one interpolation voltage and realizing fine interpolation as with FIG. 6.

Amplifiers (third output amplifiers) 701, 702, ..., 703 which amplify the sum of the output of the amplifier 111 and the output of the amplifier 112 are provided at the output side. The amplifier 701 corresponds to the amplifier 122 in FIG. 1; the amplifiers 702, ..., 703 are newly added to the configuration in FIG. 1. The gains of the amplifiers 701, 702 ... 703 are determined from a desired interpolation value, and the input signal from the amplifier 111 is amplified by different gains. The amplification gains on the signal from the amplifier 112 may be identical to each other in each amplifier.

A plurality of amplifiers (fourth output amplifiers) which amplify a difference between the output of the amplifier 111 and the output of the amplifier 113 (see FIG. 1) are also provided (not shown). These amplifiers amplify the input signal from the amplifier 111 by different gains. The amplification gains on the signal from the amplifier 113 may be identical to each other in each amplifier.

As described above, according to this embodiment, use of only one interpolation voltage allows fine interpolation. Accordingly, in comparison with the fifth embodiment (FIG. 6), reduction in area can be facilitated.

Figure 8:
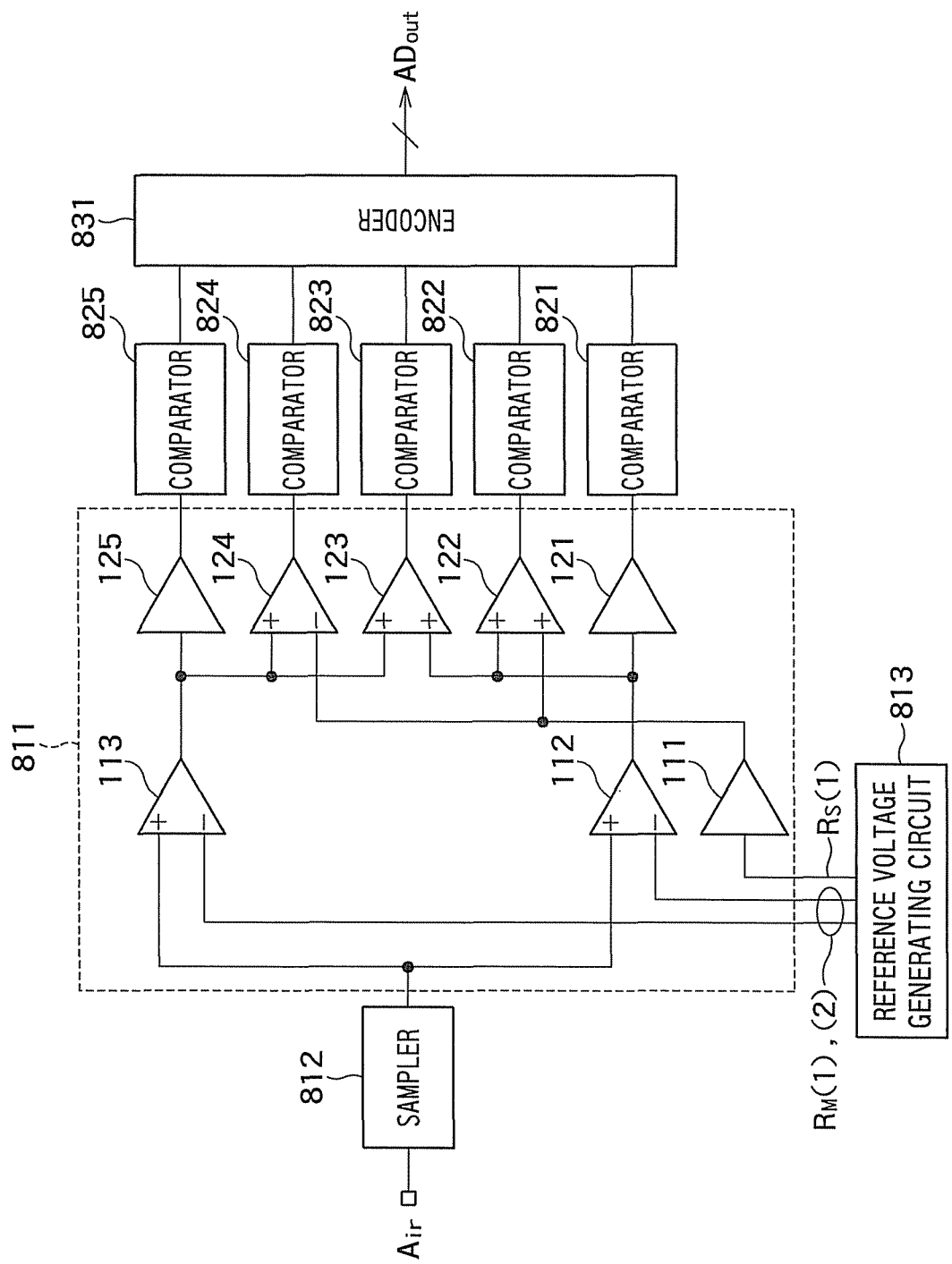
FIG. 8 is a block diagram of a parallel A/D converter according to a seventh embodiment.

FIG. 8 is a block diagram of a parallel A/D converter including a signal interpolation device 811 shown in FIG. 1 according to a seventh embodiment. It is a matter of course that a parallel A/D converter including a signal interpolation device having a configuration other than that in FIG. 1 can be configured.

A sampler 812 generates an input signal by sampling an analog signal Air.

A reference voltage generating circuit 813 generates reference voltages including reference voltages "$R_M(1)$" and "$R_M(2)$" and an interpolation voltage "$R_S(1)$". The reference voltages "$R_M(1)$" and "$R_M(2)$" may be generated by a typical method, such as resistive division of voltage representing a range of an input signal. The interpolation voltage "$R_S(1)$" may be generated using the configuration shown in FIG. 2.

Comparators 821, 822, 823, 824 and 825 compare the output signals of the signal interpolation device 811, more specifically, the output signals of the amplifiers 121, 122, 123, 124 and 125 with a reference value, thereby acquiring respective digital values (logic value). A fixed voltage may be used as the reference value.

The encoder 831 converts the digital values acquired from the comparator 821 to 825 into binary data including a plurality of bits. For instance, the values are converted into binary data including two bits.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:
1. A signal interpolation device, comprising:
 a first amplifier to generate a first signal representing a difference between an input signal and a first reference voltage;

a second amplifier to generate a second signal representing a difference between the input signal and a second reference voltage;
a first output amplifier to amplify the first signal to generate a first output signal;
a second output amplifier to amplify the second signal to generate a second output signal;
a third output amplifier to amplify a sum of a first interpolation signal and the first signal to generate a third output signal, the first interpolation signal representing a voltage generated by dividing a difference between the first reference voltage and the second reference voltage by "2^n"("n" is an integer of at least two); and
a fourth output amplifier to amplify a difference between the second signal and the first interpolation signal to generate a fourth output signal.

2. The device according to claim 1, further comprising a fifth output amplifier to amplify a sum of the first signal and the second signal to acquire a fifth output signal.

3. The device according to claim 1, further comprising an amplifier to amplify the first interpolation signal,
wherein the third output amplifier and the fourth output amplifier use the first interpolation signal amplified by the amplifier.

4. The device according to claim 1, further comprising:
a voltage divider to divide a difference between the second reference voltage and the first reference voltage to acquire a divided signal;
a subtractor to generate a signal representing difference between the divided signal and the first reference voltage, or a signal representing a difference between the second reference voltage and the divided signal; and
a divider to divide the signal by a predetermined value to generate the first interpolation signal.

5. The device according to claim 1,
wherein the input signal is formed as differential signals, the first interpolation signal is formed as differential signals, the first reference voltage is formed as differential signals and the second reference voltage is formed as differential signals,
the first amplifier generates first differential signals as the first signal based on the input signal and the first reference voltage,
the second amplifier generates second differential signals as the second signal based on the input signal and the second reference voltage,
the first output amplifier amplifies the first differential signals to generate first output differential signals as the first output signal,
the second output amplifier amplifies the second differential signals to generate second output differential signals as the second output signal,
the third output amplifier generates third output differential signals as the third output signal based on the first differential signals and the first interpolation signal, and
the fourth output amplifier generates fourth output differential signals as the fourth output signal based on the second differential signals and the first interpolation signal.

6. The device according to claim 1, further comprising:
a third amplifier to generate a third signal representing a difference between the input signal and a third reference voltage;
a sixth output amplifier to amplify the third signal to generate a sixth output signal;
a seventh output amplifier to amplify a sum of the first interpolation signal and the second signal to generate a seventh output signal; and
an eighth output amplifier to amplify a difference between the third signal and the first interpolation signal to generate an eighth output signal.

7. The device according to claim 1, further comprising:
"m−1" third output amplifiers to amplify sums of second to m-th interpolation signals corresponding to different values of the "n" and the first signal to generate respective output signals; and
"m−1" fourth output amplifiers to amplify differences between the second signal and the second to m-th interpolation signals to generate respective output signals.

8. The device according to claim 1, further comprising:
a plurality of the third output amplifiers; and
a plurality of the fourth output amplifiers,
wherein the third output amplifiers amplify the first interpolation signal by different gains to generate respective third output signals using amplified first interpolation signals, and
the fourth output amplifiers amplify the first interpolation signal by different gains to generate respective fourth output signals using amplified first interpolation signals.

9. A parallel A/D converting device, comprising:
the signal interpolation device according to claim 1;
a sampler to sample an analog signal to generate the input signal;
a reference voltage generating circuit to generate a plurality of reference voltages including the first and second reference voltages, and at least one interpolation voltage;
a plurality of comparators to compare a plurality of output signals including the first to fourth output signals with a reference value to acquire digital values; and
an encoder to convert the digital values into binary data.

* * * * *